(12) United States Patent
Ruhm

(10) Patent No.: US 8,082,127 B2
(45) Date of Patent: Dec. 20, 2011

(54) METHOD FOR DETERMINING THE SPATIAL DISTRIBUTION OF MAGNETIC RESONANCE SIGNALS THROUGH MULTI-DIMENSIONAL RF EXCITATION PULSES

(75) Inventor: Wolfgang Ruhm, Ettlingen (DE)

(73) Assignee: Bruker BioSpin MRI GmbH, Ettlingen (DE)

( * ) Notice: Subject to any disclaimer, the term of this patent is extended or adjusted under 35 U.S.C. 154(b) by 0 days.

(21) Appl. No.: 12/678,292

(22) PCT Filed: Sep. 13, 2008

(86) PCT No.: PCT/EP2008/007617
§ 371 (c)(1),
(2), (4) Date: Mar. 16, 2010

(87) PCT Pub. No.: WO2009/036936
PCT Pub. Date: Mar. 26, 2009

(65) Prior Publication Data
US 2010/0286500 A1    Nov. 11, 2010

(30) Foreign Application Priority Data
Sep. 18, 2007  (DE) .................. 10 2007 044 463

(51) Int. Cl.
*G01R 33/54* (2006.01)
*G06F 19/00* (2006.01)

(52) U.S. Cl. ........ 702/189; 702/190; 702/193; 324/300; 324/301; 324/307; 324/309; 324/310; 600/407; 600/408; 600/409; 600/410; 600/411; 600/413; 600/414; 600/415; 600/416; 600/417; 600/418; 600/419; 600/420; 600/455

(58) Field of Classification Search .................. 702/189, 702/190, 193; 324/300, 301, 307, 309, 310; 600/407–455
See application file for complete search history.

(56) References Cited

U.S. PATENT DOCUMENTS

| | | | |
|---|---|---|---|
| 5,270,653 A | 12/1993 | Pauly | |
| 5,903,149 A | 5/1999 | Gonen | |
| 6,005,391 A | 12/1999 | Boernert | |
| 7,106,060 B2 * | 9/2006 | Hennig | 324/309 |
| 7,411,397 B2 * | 8/2008 | Shankaranarayanan et al. | 324/309 |
| 7,719,269 B2 * | 5/2010 | Petersson et al. | 324/307 |
| 7,772,844 B2 * | 8/2010 | Hurd | 324/309 |
| 2006/0132132 A1 | 6/2006 | Zhu | |
| 2007/0090838 A1 * | 4/2007 | Hennig | 324/307 |

(Continued)

OTHER PUBLICATIONS

Bilski NPL 1.*

(Continued)

*Primary Examiner* — Sujoy Kundu
(74) *Attorney, Agent, or Firm* — Paul Vincent

(57) ABSTRACT

A method for determining the spatial distribution of magnetic resonance signals from an imaging area, wherein nuclear spins are excited in a spatially encoded fashion through multi-dimensional RF pulses, is characterized in that in a definition step, a resolution grid with resolution grid cells is predetermined, and in accordance with a predetermined phase encoding scheme, an excitation pattern is defined for each phase encoding step, in which the amplitudes within the imaging area are set in accordance with a predetermined distribution identically for each phase encoding step. In a preparatory step, the amplitude and phase behavior of the RF pulses to be irradiated is calculated in accordance with a predetermined k-space trajectory for each defined complex excitation pattern.

20 Claims, 13 Drawing Sheets

U.S. PATENT DOCUMENTS

2009/0128148 A1* 5/2009 Hennig et al. ............... 324/309
2010/0156417 A1* 6/2010 Petersson et al. ............ 324/309

OTHER PUBLICATIONS

Bilski NPL 2.*

John Pauly et al., "A k-Space Analysis of Small-Tip-Angle Excitation", Journal of Magnetic Resonance 81 (1989) pp. 43-56.

Suwit Saekho et al., "Fast-$k_z$ Three-Dimensional Tailored Radiofrequency Pulse for Reduced $B_1$ Inhomogeneity", Magnetic Resonance in Medicine 55:719-724 (2006).

Ulrich Katscher et al., "Transmit SENSE", Magnetic Resonance in Medicine 49:144-150 (2003).

Yudong Zhu, "Parallel Excitation With an Array of Transmit Coils", Magnetic Resonance in Medicine 51:775-784 (2004).

Chun-Yu Yip et al., "Iterative RF Pulse Design for Multidimensional, Small-Tip-Angle Selective Excitation", Magnetic Resonance in Medicine 54:908-917 (2005).

William Grissom et al., "Spatial Domain Method for the Design of RF Pulses in Multicoil Parallel Excitation", Magnetic Resonance in Medicine 56:620-629 (2006).

Kawin Setsompop et al., "Parallel RF Transmission With Eight Channels at 3 Tesla", Magnetic Resonance in Medicine 56:1163-1171 (2006).

Peter Ullmann et al., "Experimental Analysis of Parallel Excitation Using Dedicated Coil Setups and Simultaneous RF Transmission on Multiple Channels", Magnetic Resonance in Medicine 54:994-1001 (2005).

* cited by examiner

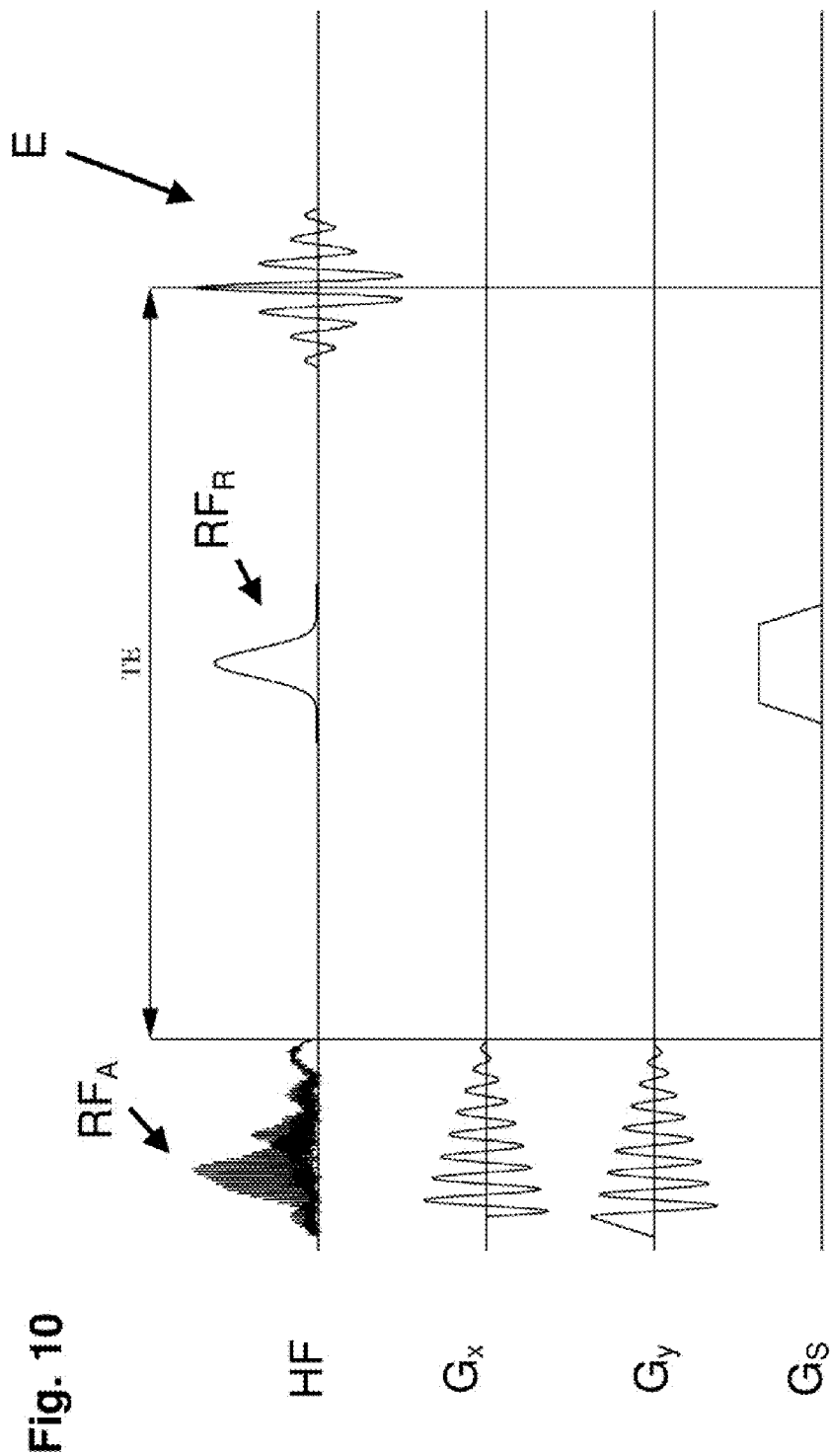

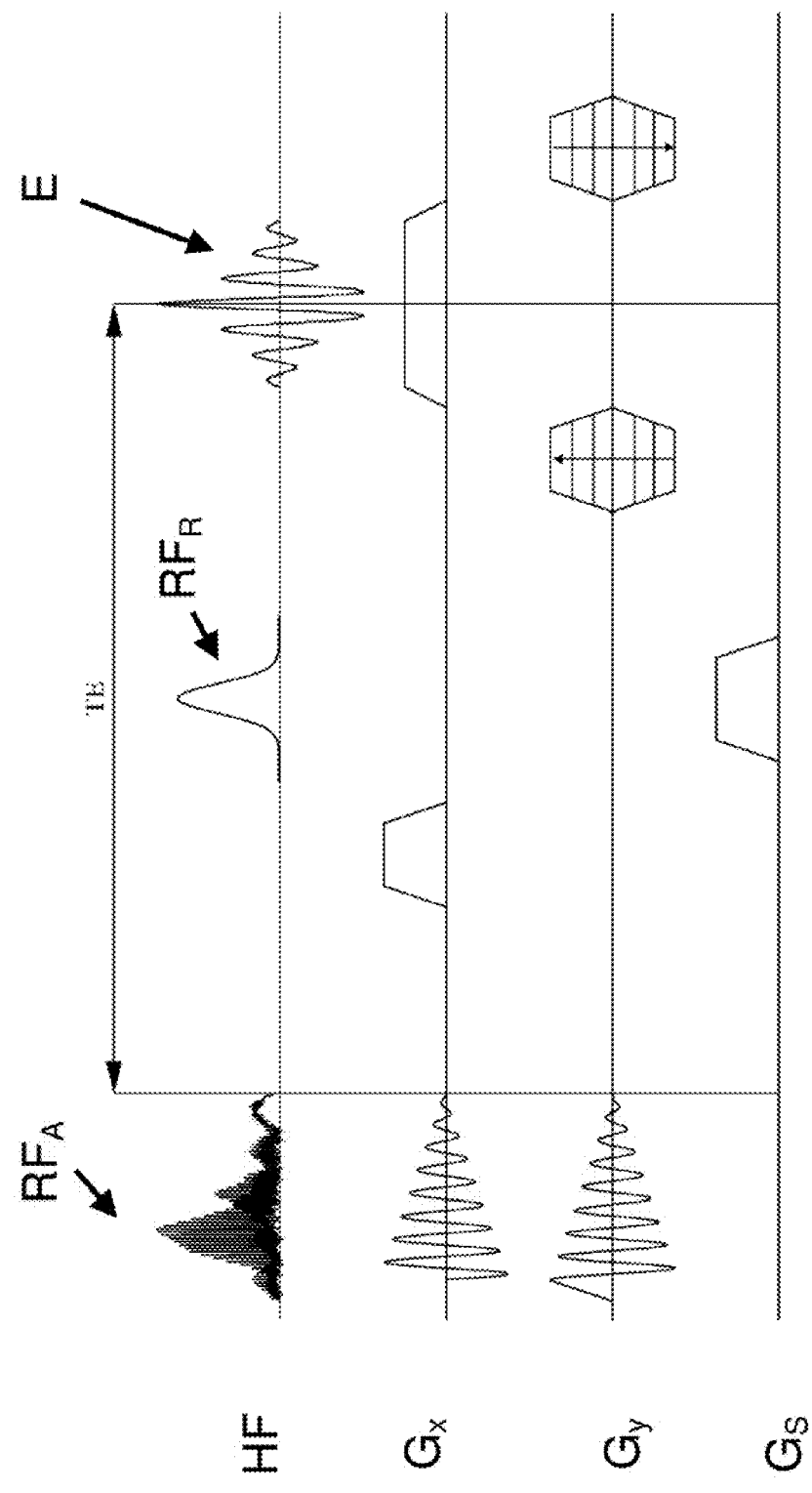

METHOD FOR DETERMINING THE SPATIAL DISTRIBUTION OF MAGNETIC RESONANCE SIGNALS THROUGH MULTI-DIMENSIONAL RF EXCITATION PULSES

This application is the national stage of PCT/EP2008/007617 filed on Sep. 13, 2008 and also claims Paris Convention priority to DE 10 2007 044 463.1 filed Sep. 28, 2007.

BACKGROUND OF THE INVENTION

The invention concerns a method for determining the spatial distribution of magnetic resonance signals from a predetermined imaging area that consists of at least one extended and interrelated region within a volume under investigation of a nuclear magnetic resonance apparatus, wherein nuclear spins are excited by multi-dimensional RF-pulses using magnetic field gradients and an RF transmitting antenna means with at least one transmitting element, wherein in a definition step, a k-space trajectory, which is to be generated through magnetic field gradient switching and passed through during excitation, and a phase encoding scheme with phase encoding steps are determined for spatial encoding, in a preparatory step, the amplitude and phase behavior with time of the RF pulses to be irradiated for exciting the nuclear spins is calculated for each transmitting element of the transmitting antenna means for the selected k-space trajectory, in an execution step, nuclear spins are excited within the volume under investigation during each phase encoding step through a multi-dimensional RF pulse, phase encoding takes place according to the phase encoding scheme, and magnetic resonance signals are acquired using a receiver antenna means, in a reconstruction step, two- or three-dimensional spatial distribution and/or spatial allocation of the magnetic resonance signals and/or values derived therefrom are calculated from the magnetic resonance signals acquired in all phase encoding steps, and in a display step, the results of reconstruction and/or one or more values derived therefrom are stored and/or displayed.

A method of this type is disclosed in [4]. In this conventional method, spatial encoding is performed in a period subsequent to excitation.

Magnetic resonance imaging (MRI), which is also called magnetic resonance tomography (MRT), and spatially resolved magnetic resonance spectroscopy (MRS), which is also called spectroscopic imaging (SI), chemical shift imaging (CSI) or multi-voxel localization MRS, are widely used techniques for non-destructive imaging of the inside of an object under investigation, and are based on the spatially resolved measurement of magnetic resonance signals from the object under investigation. The object under investigation is exposed to a substantially static and homogeneous magnetic basic field within a basic field magnet, and the nuclear spins contained therein are consequently oriented with respect to the direction of the basic field, generally selected as the z-direction of a magnetic coordinate system. In an MR investigation, the nuclear spins of the object under investigation, which are oriented in this fashion, are excited through irradiation of electromagnetic radio frequency (RF) pulses using one or more RF transmitting antennas, to perform precession motions, the frequencies of which are proportional to the local magnetic field strengths. In the MRI and SI methods, which are generally used today, the precession motions of the nuclear spins are superposed with a spatial encoding for all spatial directions to be spatially resolved, through time-variant superposition of magnetic gradient fields $G_x$, $G_y$, $G_z$, which are generated by a gradient system. This spatial encoding is usually described by a scheme in a spatial space through Fourier transformation and spatial conjugation: the so-called k-space. The transverse component of magnetization associated with the precessing nuclear spins induces voltage signals in one or more RF receiver antennas that generally surround the object under investigation. Time-variant magnetic resonance signals are generated by pulse sequences that contain specially selected sequences of RF pulses and gradient pulses, in such a fashion that they can be converted into corresponding spatial images. This is realized in accordance with one out of a large number of well-known reconstruction techniques after acquisition, amplification, and digitization of the RF signals using an electronic receiver system, processing thereof using an electronic computer system, and storage in two- or multi-dimensional data sets. The pulse sequence that is used typically contains a sequence of measuring processes, which are also called phase encoding steps, in which the gradient pulses are varied in accordance with the selected localization method in correspondence with the phase encoding scheme that is used.

One substantial precondition for spatially accurate imaging of the magnetic resonance signals of the object under investigation is that the technical imperfections of the MR measuring system can be neglected or the deviations from the ideal behavior are known and can be correspondingly corrected.

In magnetic resonance imaging and spatially resolved magnetic resonance spectroscopy, spatial localization is usually obtained either by Fourier encoding or spatially selective excitation [1, 2].

In Fourier encoding, the nuclear spins to be investigated are simultaneously excited in the entire volume under investigation and spatially localized through imposition of a spatially dependent phase or frequency encoding of their precession motion. This imposition of spatial encoding is realized by gradient pulses in a phase encoding period subsequent to excitation, in which the phase of the precession motion is changed in dependence on the location, and also during signal read-out through application of a read gradient, thereby obtaining spatially dependent modulation of the precession frequency. Both encodings are usually performed according to an encoding scheme which permits determination of the spatial distribution of the magnetic resonance signals using Fourier transformation.

Spatially selective excitation is a technique which is widely used in magnetic resonance imaging, and is utilized to spatially limit transverse magnetization generated during excitation, and/or to spatially vary its amplitude and phase in the excitation volume. For slice selection, which is the most frequent case of selective excitation, the excitation volume is reduced to a predetermined slice. In volume-selective MR spectroscopy (volume-selective spectroscopy VSS), the selection of an area under investigation, which is generally small compared to the object under investigation, is usually also based on slice-selective excitation and refocusing pulses, wherein spatial selection is successively carried out only in one spatial direction, in each case, using a corresponding gradient pulse.

MRI and MRS methods were also developed for accelerating multi-slice acquisitions, in which several substantially parallel slices are simultaneously excited with different phase encoding in several phase encoding steps, their magnetic resonance signals are acquired, and the signals are allocated to the respective excitation slice through suitable data reconstruction, e.g. Hadamard transformation [3].

Multi-dimensional selective excitation using multi-dimensional RF pulses [4, 5], in which the excitation volume is limited in more than one direction or the excitation is modulated in more than one direction, also produced numerous applications, e.g. excitation of a small, three-dimensional volume or also of several volumes simultaneously within one substantially larger object under investigation for spatially resolved spectroscopy, imaging of a selectively excited "region of interest" (ROI) with reduced field of view (FOV) in order to reduce the measuring time, excitation of special volumes that are adjusted to the structures of the object under investigation, or also echo-planar imaging with reduced echo train lengths. The amplitude and phase modulation during excitation may also be used to compensate for disadvantageous effects of an inhomogeneous $B_1$ field of the RF antennas that are used for transmission. This is an application that has become immensely important due to the strong increase in high-field MRI systems [6].

In other conventional MRI and MRS methods, a few spatially separated areas under investigation are simultaneously selectively excited using multi-dimensional excitation. With this excitation, the magnetic resonance signals are superposed with phase encoding using a suitable encoding scheme to permit separation of the signals with respect to their area of origin, thereby simultaneously acquiring the magnetic resonance signals of all areas under investigation [7].

One decisive disadvantage of the conventional MRI and MRS methods for determining the spatial distribution of magnetic resonance signals within an extended and interrelated region on the basis of spatial encoding is the fact that at least part of the spatial encoding is performed in a phase encoding period subsequent to excitation. The time required therefor can be reduced only to a limited degree due to technical and/or physiological limits of the gradient strengths that can be used and/or the switching times, which delays signal acquisition. For spatially resolved measurement of magnetic resonance signals with very short relaxation time, it is i.a. advantageous and in some practical applications absolutely necessary to largely eliminate this delay. Inclusion of spatial encoding of an interrelated region into the excitation period has been realized up to now for only one spatial dimension. This offers no fundamental solution, in particular, for spectroscopic investigations, in which the signals are acquired without application of a spatial encoding gradient.

One further disadvantage of the above-mentioned MRI and MRS methods is the fact that each phase encoding step is performed with different magnetic gradient pulses that generally differ at least with respect to amplitude and/or duration. Due to technical-physical imperfections in the generation of the gradient pulses, the phase changes of the precession motion of the nuclear spins caused with each phase encoding step will generally contain different errors, which results in spatial inaccuracies in Fourier decoding.

Multi-dimensional excitation using multi-dimensional RF-pulses has hitherto only been used for spatial encoding of separate regions, wherein, if desired, spatial resolution within the individual areas is only obtained through classical spatial encoding subsequent to excitation, which means that the aim to minimize the delay of signal acquisition is not met.

A further aspect of the technical progress of recent years has proven to be advantageous for the practical use of multi-dimensional RF pulses. In the past, spatially selective excitation was generally carried out using one individual RF transmitting antenna with a substantially homogeneous transmitting field ($B_1$ field) in combination with the gradient system. Inspired by the success of parallel imaging, in which the signals are acquired using an arrangement of several RF receiver antennas, which is also called an antenna array in technical literature, in the meantime one has also started to use such arrays for transmission in selective excitation. This allows partial replacement of spatial encoding of the excitation locations, which is realized in selective excitation analogously to acquisition through variation of gradient fields by so-called sensitivity encoding, thereby reducing the length of the excitation pulses. This means that the information is utilized that is contained in the various spatial variations of the transmitting fields of the individual array elements, which are also called transmission profiles below [8, 9].

One of the basic questions concerning the use of spatially selective excitation is the determination of the RF pulses which must be irradiated by the transmitting antenna means in order to generate the desired excitation pattern in combination with the gradient-generating k-space trajectory. In the article "A k-space analysis of small tip-angle excitation" [4], Pauly et al. describe a method for single-channel, spatially selective excitation, with which the sought pulse shape $B_1(t)$ can be calculated based on a mathematical analogy of selective excitation with Fourier imaging substantially through Fourier transformation of the desired excitation pattern and scanning of the Fourier transform along the predetermined k-space trajectory. Katscher et al. extended this calculation method for the case of an antenna array with several independent transmitting channels [2].

It is the object of the present invention to provide a method for determining the spatial distribution of magnetic resonance signals from at least one predetermined extended and interrelated region within a volume under investigation, which considerably reduces the delay time between excitation of the nuclear spins and acquisition of the magnetic resonance signals, and ensures that nuclear spins with very short transverse relaxation times can be used for spatially resolved measurement.

SUMMARY OF THE INVENTION

This object is achieved by a method in accordance with the independent claim. Further variants and further advantageous properties and embodiments are described in the dependent claims.

The definition step of the inventive method predetermines a two- or three-dimensional resolution grid with resolution grid cells, which covers the object under investigation. Moreover, an at least two-dimensional grid of directly neighboring encoding cells is determined for each interrelated region of the imaging area, wherein each encoding cell consists of one or more resolution grid cells of the imaging area, for which the same spatial encoding is to be performed. Moreover, instead of the phase encoding scheme disclosed e.g. in [4] for spatial encoding subsequent to excitation, a phase encoding scheme for spatial encoding during the excitation of the nuclear spin is defined and in this respect, a complex excitation pattern for all resolution grid cells is defined for each phase encoding step, in which the amplitudes of the resolution grid cells within the imaging area are set in correspondence with a predetermined distribution identically for each phase encoding step, the amplitudes of the remaining resolution grid cells are set to zero, and the phases of the resolution grid cells within the imaging area are set in accordance with the defined phase encoding scheme.

In accordance with the preparatory step of the invention, the amplitude and phase behavior of the RF pulse to be irradiated is calculated for each defined complex excitation pattern of the phase encoding steps and for each transmitting element.

In the execution step, the nuclear spins are repeatedly excited, wherein for each phase encoding step, the calculated RF pulse is applied during passage of the predetermined k-space trajectory, such that phase encoding is performed within the imaging area during excitation of the nuclear spins and not in a period subsequent to excitation. The nuclear spins are thereby excited in a spatially encoded fashion in the imaging area in correspondence with the phase encoding scheme.

"RF pulse" thereby means the totality of all RF wave shapes used in the transmitting elements during one transmission process.

The inventive method performs multi-dimensional spatial encoding within an interrelated region during the excitation period using multi-dimensional RF pulses. The interrelated region in each spatial direction to be imaged consists of at least two directly neighboring encoding cells. The inventive method therefore realizes two-dimensional or three-dimensional imaging, wherein subsequent phase encoding periods can be completely eliminated or at least be eliminated to a larger extent than before, thereby significantly reducing or even practically completely eliminating the delay between excitation and data acquisition. In this fashion, magnetic resonance signals with extremely short transverse relaxation times can be measured in a spatially resolved fashion.

The nuclear spins are preferably excited by means of a transmitting antenna means comprising at least two transmitting elements.

This permits undersampling of the k-space trajectory, which again reduces the duration of the irradiated RF pulses, which is of decisive advantage. This suppresses i.a. measuring errors caused by off resonances and increases the spectral information accessible during measurement.

In a particularly preferred variant of the inventive method, each phase encoding step is performed with identical gradient pulses. This reduces aberrations due to imperfections in the realization of the gradient fields.

It is advantageous, i.a. with respect to the technical requirements for the gradient system, for the k-space trajectory that is used to comprise at least one spiral part that is passed through from the outside to the inside or from the inside to the outside.

In a further development of this variant, the k-space trajectory that is used comprises several spiral parts which are passed through alternately from the outside to the inside and from the inside to the outside. The transition time between the spiral parts is thereby advantageously reduced.

With particular advantage, the k-space trajectory that is used terminates in the center of the k-space or in its vicinity when irradiation of the RF-pulse is terminated, and/or the gradient pulses that are thereby used reach very small or negligibly small amplitudes. This permits start of data acquisition with only minimum delay.

The imaging area is preferably adjusted to anatomical, morphological or functional conditions of the object under investigation. This excludes i.a. defined regions of the object under investigation, which could disturb the measurement.

In one variant of the inventive method, a two-dimensional RF pulse is used for excitation, and spatial selection in the third spatial direction is realized through slice-selective phase refocusing. This permits two-dimensional imaging with identical behavior of the gradient pulses in each phase encoding step.

A two-dimensional RF pulse may alternatively be used for excitation, and spatial encoding and spatial selection in the third spatial direction may be realized by frequency encoding through the action of a gradient in a direction orthogonal with respect to excitation encoding during data acquisition. This provides three-dimensional imaging with identical behavior of the gradient pulses in each phase encoding step.

Each phase encoding step may alternatively include acquisition of an FID (free induction decay) signal or spin echo and determination of the spatial distribution and/or spatial allocation of one data point of the FID or spin echo or a combination of several corresponding data points of the FID or spin echo. The spatial distribution of the magnetic resonance signals can thereby be determined at a certain time after excitation.

In a further alternative variant of the inventive method, an FID or spin echo is acquired in each phase encoding step, from which the spectral distribution is calculated, and the spatial distribution and/or the spatial allocation of a component or a combination of several components of spectral distribution or values derived therefrom are determined. This permits determination of the spatial distributions of chemical properties of the object under investigation. Spatial distribution thereby means that each local vector is allocated to a value resulting from data acquisition within the imaging area, i.e. a mapping of the imaging area into a value region. Spatial allocation means that one single value that results from data acquisition is allocated to a spatial vector or a number of spatial vectors (e.g. distributed or interrelated region) within the imaging area.

The phase encoding scheme may advantageously be determined in such a fashion that different, not directly spatially neighboring resolution grid cells within the imaging area have the same spatial encoding. This is reasonable, in particular, when the magnetic resonance signals from certain different excitation cells are to be combined without spatial differentiation between them, thereby reducing the measuring time.

With particular advantage, different numbers of neighboring resolution grid cells are given the same spatial encoding within the imaging area in dependence on the location, thereby determining the phase encoding scheme to obtain a spatially varying spatial resolution which can be adjusted to the conditions of the object under investigation. The measuring time can thereby be optimized.

The use of a phase encoding scheme is particularly advantageous with respect to the image quality, spatial resolution and imaging precision that can be obtained with the inventive method, wherein each convex linear combination of spatial codes of neighboring adjacent encoding cells represents a spatial code for at least part of the encoding cells, preferably for more than half of the encoding cells. For that spatial code, the encoding specification allocates a location that is located within the convex envelope of the contributing encoding cells. "Spatial code" thereby means a set of phase values which are allocated to the same encoding cell or the same location in the imaging area in the different phase encoding steps. "Encoding specification" means the image of the amount of realized spatial codes in the volume under investigation and the allocation of the defined encoding cells to the spatial codes predetermined by the phase encoding scheme.

In special variants of the inventive method, the spatial distribution and/or the spatial allocation of the magnetic resonance signals is/are calculated using Fourier transformation or Hadamard transformation or Wavelet transformation.

With respect to imaging accuracy and image quality, the calculation of a two-dimensional spatial distribution of the magnetic resonance signals is preferentially performed using two-dimensional Fourier transformation.

With respect to imaging accuracy and image quality, the calculation of a three-dimensional spatial distribution of the magnetic resonance signals is preferentially performed using three-dimensional Fourier transformation.

The excitation amplitudes may also be predetermined within the imaging area in accordance with equal distribution.

This suppresses falsification of the acquired image due to the transmitting characteristic of the transmitting antenna means, e.g. in the form of local brightening and shading.

It may be advantageous to set the nuclear spin system into a steady state prior to performance of the phase encoding steps through repeated passage of the excitation cycle of the execution step without data acquisition or evaluation.

It may also be advantageous for the image quality to apply spoiler gradients in each phase encoding step for dephasing disturbing residual transverse magnetization.

It may moreover be useful to utilize separate spatial encoding subsequent to excitation through the action of gradients to obtain additional spatial information of the magnetic resonance signals. This may be, in particular, subsequent spatial encoding, which corresponds at least partially to the excitation encoding with respect to encoding region and/or direction, or subsequent spatial encoding, which differs completely from the excitation encoding with respect to encoding region and/or direction, and/or subsequent spatial encoding which is used to determine the spatial distribution of the magnetic resonance signals at a later time that is predetermined by the delay of subsequent spatial encoding with respect to excitation.

In a preferred variant of the inventive method, the allocations of the magnetic resonance signals to the encoding cells, which are obtained from phase encoding during excitation of the nuclear spins, are used to perform spatially dependent corrections of the acquired signals and/or of the reconstructed and/or derived data, in particular, to correct errors which are caused by the spatial inhomogeneities of the basic magnetic field.

Further advantages of the invention can be extracted from the description and the drawing. The features mentioned above and below may be used individually or collectively in arbitrary combination. The shown and described embodiments are not to be understood as exhaustive enumeration but have exemplary character for describing the invention.

BRIEF DESCRIPTION OF THE DRAWING

FIG. 10 shows a schematic view of a measuring sequence that is suited for performing an inventive phase encoding step;

FIG. 11c shows superposition of the reconstructed image of FIG. 11b on the pilot image of FIG. 11a;

FIG. 12 shows a schematic view of the measuring sequence used for measuring the excitation pattern;

DESCRIPTION OF THE PREFERRED EMBODIMENT

Figure 1:
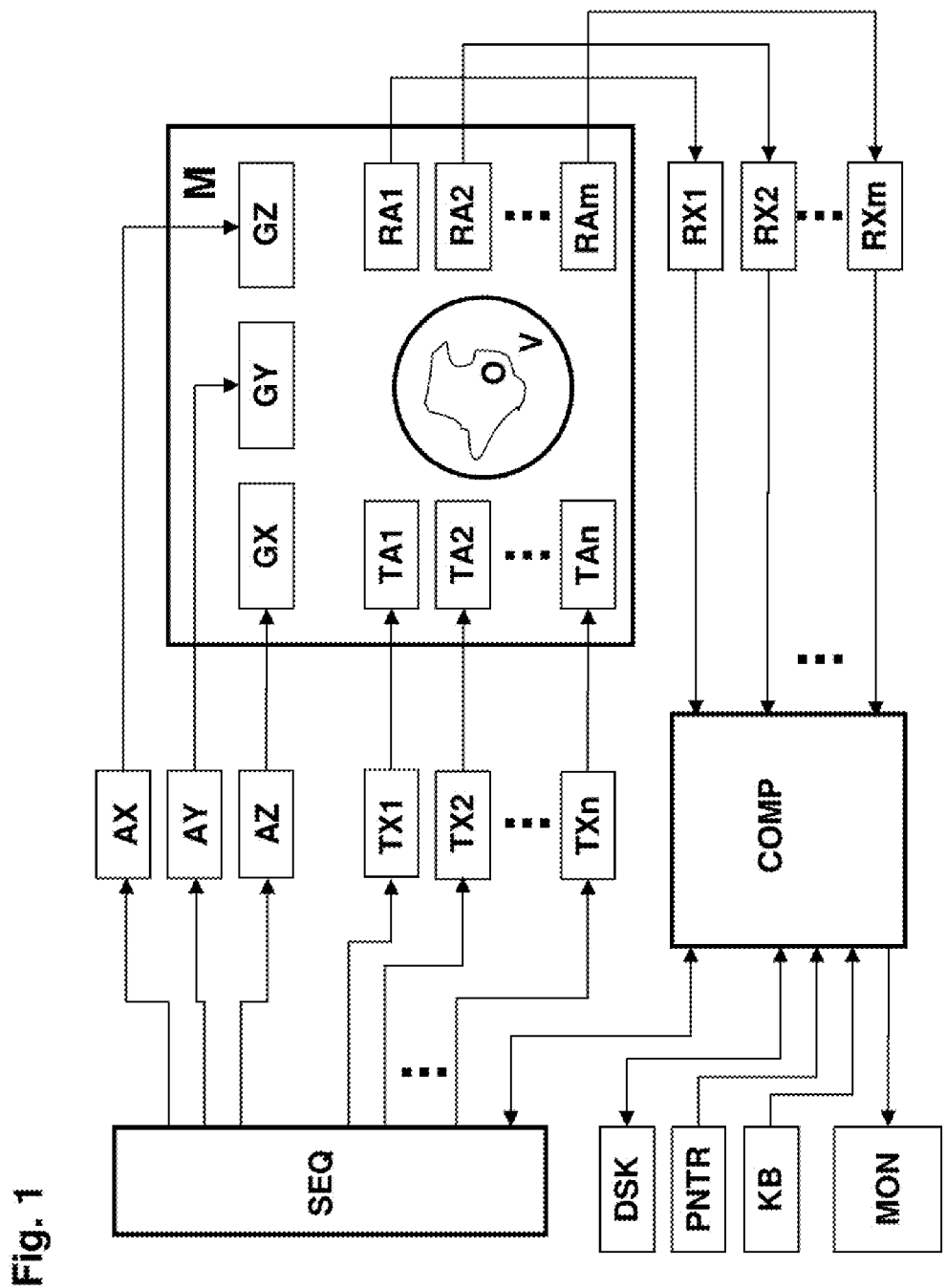
FIG. 1 shows a schematic view of an MR measuring system that is suited for performing the inventive method.

FIG. 1 schematically shows an MR measuring system which is suited for performing the inventive method. The system contains a main magnet M for generating the basic magnetic field which is substantially homogeneous and static in a volume under investigation V. Three sets of gradient coils GX, GY, and GZ are introduced into the bore of the main magnet M, which surround the volume under investigation V, and can superpose additional magnetic fields of controllable duration and strength with constant gradients on the basic field. Gradient amplifiers AX, AY, and AZ, which are driven by a sequence control unit SEQ for timely generation of gradient pulses, provide the gradient coils GX, GY, GZ with electric current for generating substantially linear gradient fields.

Several transmitting elements TA1 to TAn are located in the gradient field system, the entirety of which is also called transmitting antenna means. They surround an object under investigation O and are fed by several independent RF power transmitters TX1 . . . TXn. The RF pulses generated by these RF power transmitters TX1 . . . TXn are determined by the sequence control unit SEQ and triggered at the correct time. The transmitting elements TA1 to TAn irradiate RF pulses onto the object under investigation O located in the volume under investigation V (as described in more detail in FIG. 8), thereby exciting the nuclear spins. The resulting magnetic resonance signals are converted into electric voltage signals using one or more RF receiver elements RA1, . . . , RAm, which are then supplied to a corresponding number of receiver units RX1, . . . , RXm. The overall receiver elements RA1, . . . , RAm are also called receiver antenna means that consists of m receiver elements RA1, . . . , RAm. These are also located within the gradient coils GX, GY, GZ and surround the object under investigation O. In order to reduce the expense for equipment, the transmitting and receiver antenna means may also be designed and connected in such a fashion that one or more of the transmitting elements TA1 to TAn are also used for receiving the magnetic resonance signals. In this case, which is not considered in FIG. 1, switching over between transmitting and receiving operation is effected by one or more electronic transmitting-receiver switch points that are controlled by the sequence control unit SEQ. This means that during the RF transmitting phases of the executed RF pulse sequence, this antenna(s) is/are connected to the corresponding RF power transmitter(s) and is/are separated from the allocated receiver channels, while for the receiver phases, the transmitters are separated and the receiver channel is connected. The received signals are amplified by the receiving units RX1 to RXm shown in FIG. 1, and are converted into digital signals using conventional signal processing methods, and passed on to an electronic computer system COMP. In addition to the reconstruction of images and spectra and values derived from the received measured data, the controlling computer system COMP serves to operate the entire MR measuring system and initiates performance of the pulse sequences through corresponding communication with the sequence control unit SEQ. The user-controlled or automatic execution of programs for adjusting the measuring system properties and/or for generating magnetic resonance images is also provided on this control computer system COMP, as well as the display of the reconstructed images, storage and management of measurement and image data and control programs. In order to perform these tasks, this computer system has at least one processor, one working memory, one computer keyboard KB, one display instrument PNTR, e.g. a computer mouse, one screen MON and one external digital storage unit DSK.

The inventive method for determining the spatial distribution of magnetic resonance signals from a predetermined imaging area, which consists of at least one predetermined extended and interrelated region within a volume under investigation of a magnetic resonance apparatus, is based on the principle to also impose spatial phase distribution onto the nuclear spins using a multi-dimensional RF pulse during excitation, in addition to spatial selection and amplitude modulation, and measure the resulting magnetic resonance signals. When the phases are imposed in several repetitive steps of this process, which comprises at least one excitation and at least one measuring period, called phase encoding step below, wherein in each step, the imposed phase distribution is varied in accordance with a predetermined phase encoding scheme for spatial encoding of the excited nuclear spins, the spatial distribution and/or spatial allocation of the magnetic resonance signals or values derived therefrom can be calculated from the measuring data in a reconstruction step.

Figure 2:
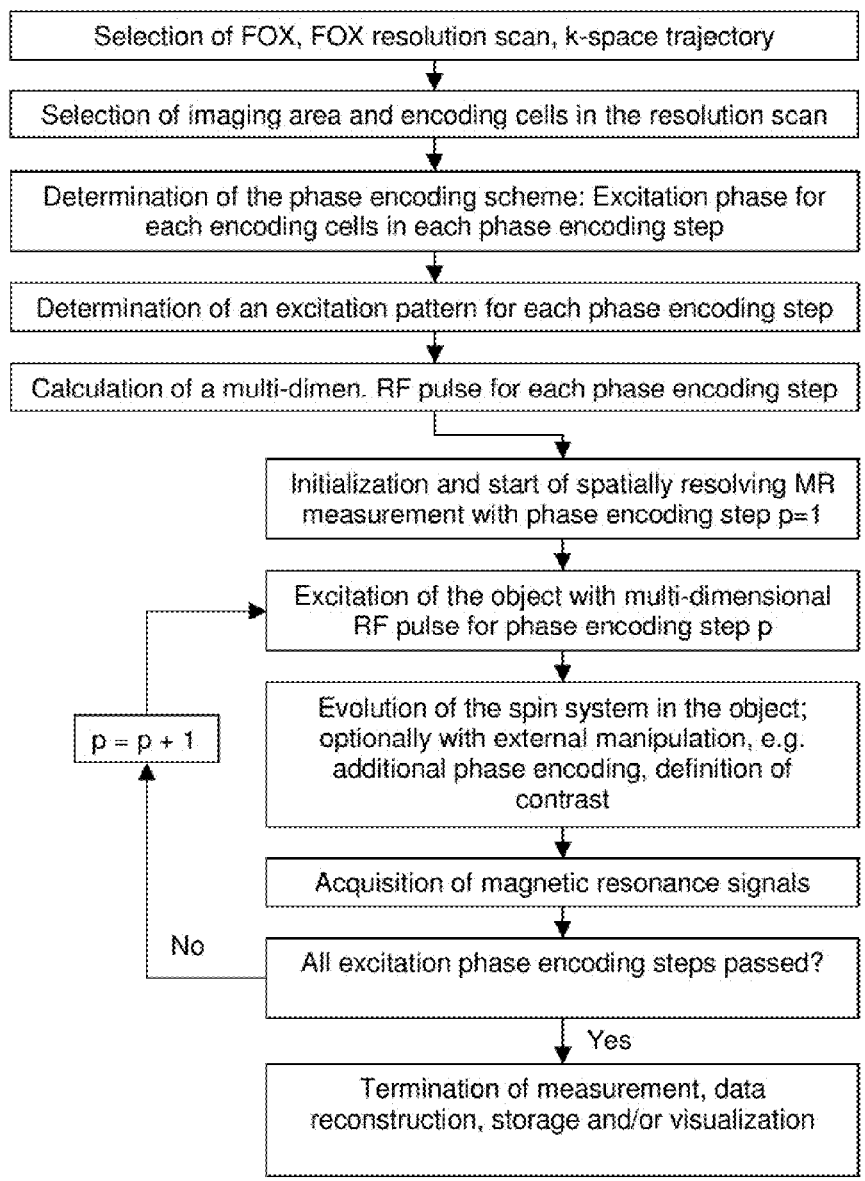
FIG. 2 shows a flow chart of the inventive method.

FIG. 2 shows the inventive method steps which are described in more detail below:

For defining the measurement, an excitation region that covers the object under investigation (Field of excitation=FOX), a basically random resolution grid that is inscribed in this excitation region, and a matched k-space trajectory are determined. Preferred k-space trajectories are thereby two-dimensional spirals which are passed through from the inside to the outside or vice versa, and stacks of spirals with parallel orientation. Advantageous in this connection are trajectories that terminate in or in the vicinity of the k-space center upon termination of RF pulse irradiation and/or for which the applied gradient pulses reach very small or negligibly small amplitudes. In these cases, the start of data acquisition is minimally delayed due to omission or minimization of time delays after excitation through switching off gradients or additional switching of rephasing gradients.

An imaging area is initially determined within the predetermined resolution grid, which consists of at least one extended and interrelated region, and the encoding cells for which spatial encoding is to be performed are determined in accordance with this imaging area. The encoding cells thereby defined correspond to the resolution grid cells to be spatially resolved within the imaging area, which are also called excitation cells below, wherein also several, not necessarily neighboring, excitations cells can be combined into one encoding cell. This combination is reasonable when the magnetic resonance signals from defined different excitation cells shall be combined without spatial differentiation between them, e.g. when these excitation cells are functionally, morphologically or physiologically equivalent within the scope of the examination to be performed. Encoding cells thus consist of excitation cells that undergo the same phase encoding. This measure reduces both the number of phase encoding steps and the measuring time. In accordance with this principle, different numbers of neighboring excitation cells with different geometrical arrangement can in each case be combined into one encoding cell, thereby realizing an inhomogeneous, i.e. spatially variable spatial resolution, which is adjusted to the spatial properties of the object under investigation, e.g. for reducing the measuring time.

A phase encoding scheme for the encoding cells is determined on the basis of these specifications, wherein the phase encoding scheme determines i.a. the phases of the respective encoding cells in the different phase encoding steps. For the preferred reconstruction methods, the number of phase encoding steps is selected in correspondence with the number of encoding cells. A relative excitation phase is defined for each phase encoding step and for each encoding cell in accordance with the selected phase encoding scheme. On this basis, a complex excitation pattern is determined for each phase encoding step, i.e. the amplitude and phase of each excitation cell within the excitation area are determined. In the simplest case, the excitation cells obtain the phases that are determined for the respective phase encoding step and a constant amplitude that is matched to the flip angle to be generated. The amplitude of the remaining resolution grid cells is set to zero for all phase encoding steps within the excitation pattern. If it is desired to impose spatial modulations of the amplitude of the transverse magnetization to be obtained during excitation, e.g. to compensate for known B1 inhomogeneities of the antenna transmission fields, a corresponding amplitude distribution must be predefined in the resolution grid cells, which is identically maintained for all phase encoding steps.

The amplitude and phase behavior with time of the radio frequency to be irradiated via the respective transmitting element is determined according to conventional calculation methods, e.g. according to [10] or [11] for the selected k-space trajectory, for each defined complex excitation pattern, according to which excitation is performed during a phase encoding step, and for each transmitting element of the transmitting antenna means, and the magnetic gradient pulses that correspond to the selected k-space trajectory are determined. The use of a multi-element transmitting antenna means, in connection with simultaneous irradiation of generally different RF pulse wave shapes via the different transmitting elements, thereby reducing the k-space trajectory through undersampling, is advantageous in that the excitation duration is correspondingly reduced, thereby significantly suppressing i.a. measuring artefacts caused by off resonances. This also increases the bandwidth of the RF pulses and correspondingly the spectral information accessible to the measurement.

During performance of the magnetic resonance measurement, a sequence of phase encoding steps is carried out, wherein in each phase encoding step, a multi-dimensional RF pulse is initially irradiated during passage of the predetermined k-space trajectory. The k-space trajectory is passed through by executing the gradient pulses calculated for this purpose, and at the same time the radio frequency is irradiated with the corresponding pre-calculated amplitude and phase behaviors via all transmitting elements of the transmitting antenna means. The nuclear magnetization is excited in the resolution grid in correspondence with the excitation pattern of the respective phase encoding step, and thereby spatially encoded within the imaging area in correspondence with the phase encoding scheme. The signal encoded in this fashion is subsequently acquired with a receiver antenna means that contains at least one receiver element, wherein during data acquisition, one gradient can optionally be applied in one spatial direction for frequency encoding. In dependence on the measuring task, the nuclear spins may be further manipulated between excitation and signal acquisition, e.g. through delays and/or further RF or gradient pulses, in particular, for forming the contrast of the images to be acquired and/or for encoding additional spatial and/or flow information, wherein any non-correctable disturbance of the phase relation of the signals between the individual excitation phase encoding steps (inventive phase encoding steps during excitation of the nuclear spins) must be prevented.

A two- or three-dimensional spatial distribution or spatial allocation of the magnetic resonance signals or values derived therefrom is calculated in a reconstruction step from the signals which are acquired in all phase encoding steps in correspondence with the phase encoding scheme that is used, e.g. through one-, two-, or three-dimensional Fourier transformation in case of a Fourier encoding scheme. The spatial allocation may consist e.g. in that coordinates of one or more original locations or one or more original regions are allocated to the measured magnetic resonance signals or values derived therefrom.

The result of the performed reconstruction and/or the values derived therefrom is finally stored and/or displayed. Two- or three-dimensional images, which display certain properties of the magnetic resonance signals, are preferably reconstructed and shown in an encoded fashion with color or grey scales. Spatial allocations can be visualized on corresponding reference images, e.g. as markings or superpositions.

The phase encoding scheme must be selected to obtain spatially accurate images and resolution, which are sufficient for the special case of application under the real conditions of the experiment.

The encoding specification initially determines the allocations between the individual encoding cells and spatial codes. If each encoding cell is moreover allocated to a representative point in the imaging area, which, for spatially exact imaging should generally be located at least within the corresponding encoding cell, the encoding specification represents a mathematical image of the amount of spatial codes in the imaging area.

Under idealized conditions, i.e. the number of defined spatial codes corresponds to the number of encoding cells, it is sufficient that these spatial codes be recognized in the acquired magnetic resonance signals in the reconstruction step, and on this basis, the representative locations of the encoding cells are reconstructed for the corresponding signal components. Due to the discrete nature of the resolution grid, the phase distribution that is predetermined for each phase encoding step thereby corresponds to a discontinuous function of the location.

For experimental realization, these desired phase distributions can only be approximately realized due to physical principles and technical imperfections. The discontinuities in the phase distributions of the individual phase encoding steps are smoothed and the actually realized phase distribution thus corresponds to a continuous function of the location. A set of a finite number of discrete phase values, which is initially predetermined for each phase encoding step, thus becomes a continuum of phase values. Considering this phenomenon for all phase encoding steps, one consequently obtains an infinite number of phase values from the finite number of spatial codes. The encoding specification must consequently be defined such that all experimentally realized spatial codes are imaged in a suitable fashion in the volume under investigation.

The spatial code of any point in the imaging area is observed to describe a criterion for the selection of a spatially accurately imaging encoding scheme. Assuming that the spreading of the phase distribution is similar for each phase encoding step, e.g. can be described through convolution with an identical point-spread function, the spatial code at this point can be described as a linear combination of the spatial codes of the neighboring encoding cells. If it is then required that each convex linear combination of the spatial codes of spatially neighboring bordering encoding cells corresponds to a spatial code which is imaged by the encoding specification on a point which is located within the convex envelope of the encoding cells that contribute to this linear combination, one obtains a criterion for suitable spatial imaging exactness and resolution. This criterion prevents the generation of spatial codes in the transition regions of neighboring encoding cells, which correspond to points within the imaging area that are remote from these encoding cells, and that magnetic resonance signals from these regions superpose other image regions due to this wrong image allocation (so-called ghosts). For example, in case of a two-dimensional resolution grid, two-dimensional Fourier encoding can be defined in correspondence with this criterion. It is basically possible to calculate a two-dimensional spatial distribution of the magnetic resonance signals using one-dimensional Fourier encoding for encoding a two-dimensional grid. Since this encoding violates the above-described criterion, the image quality will be inadequate due to the mentioned misallocations. With respect to optimum image quality, it is desired that all encoding cells of the imaging area satisfy this criterion. This requirement can be limited to part of the encoding cells if the resulting reduction of the image quality e.g. with respect to signal-to-noise-ratio, image ghosts, spatial resolution, can be accepted for the respective application.

Possible embedding of further delays and/or RF and gradient pulses between excitation and data acquisition and the option to perform data acquisition with and without the action of additional gradient pulses offers a plurality of different designs of the basic structure of the measuring sequence described in FIG. 2. For illustrating the plurality of possibilities, a few examples are mentioned, which offer many further combinations and variations:

Direct acquisition of an FID without application of further RF or gradient pulses with the options to include different numbers of FID measuring points in the evaluation, in particular, to calculate the spectral distribution of the acquired magnetic resonance signals through Fourier transformation of the FID. Corresponding spatial distributions of FID measured variables and spectral components can be determined through Fourier transformation. This corresponds to a novel two- or three-dimensional SI method.

Acquisition of a spin echo through embedding an optionally slice-selective refocusing pulse between excitation and data acquisition without application of a read gradient, with the options to vary the echo times, to include different numbers of echo measuring points in the evaluation, in particular, to calculate the spectral distribution of the acquired magnetic resonance signals through Fourier transformation of the echo. Corresponding spatial distributions of echo measuring values and spectral components can be determined through Fourier transformation. This corresponds to a novel two- or three-dimensional SI method.

Data acquisition with the action of a read gradient for spatial encoding of the read-out signal along this gradient direction. A novel three-dimensional acquisition technology is realized by using a two-dimensional RF pulse and orienting the read gradient orthogonally with respect to the plane of the k-space trajectory of this two-dimensional RF pulse. When a two-dimensional RF pulse is used and the read gradient is oriented in the plane of the k-space trajectory of this two-dimensional RF pulse, additional localization is performed in the read gradient direction at a time which is determined by the delay of signal read-out with respect to signal excitation. In a similar fashion, additional localization of the magnetic resonance signals is performed in the read gradient direction when a three-dimensional RF pulse is used.

Figure 3:
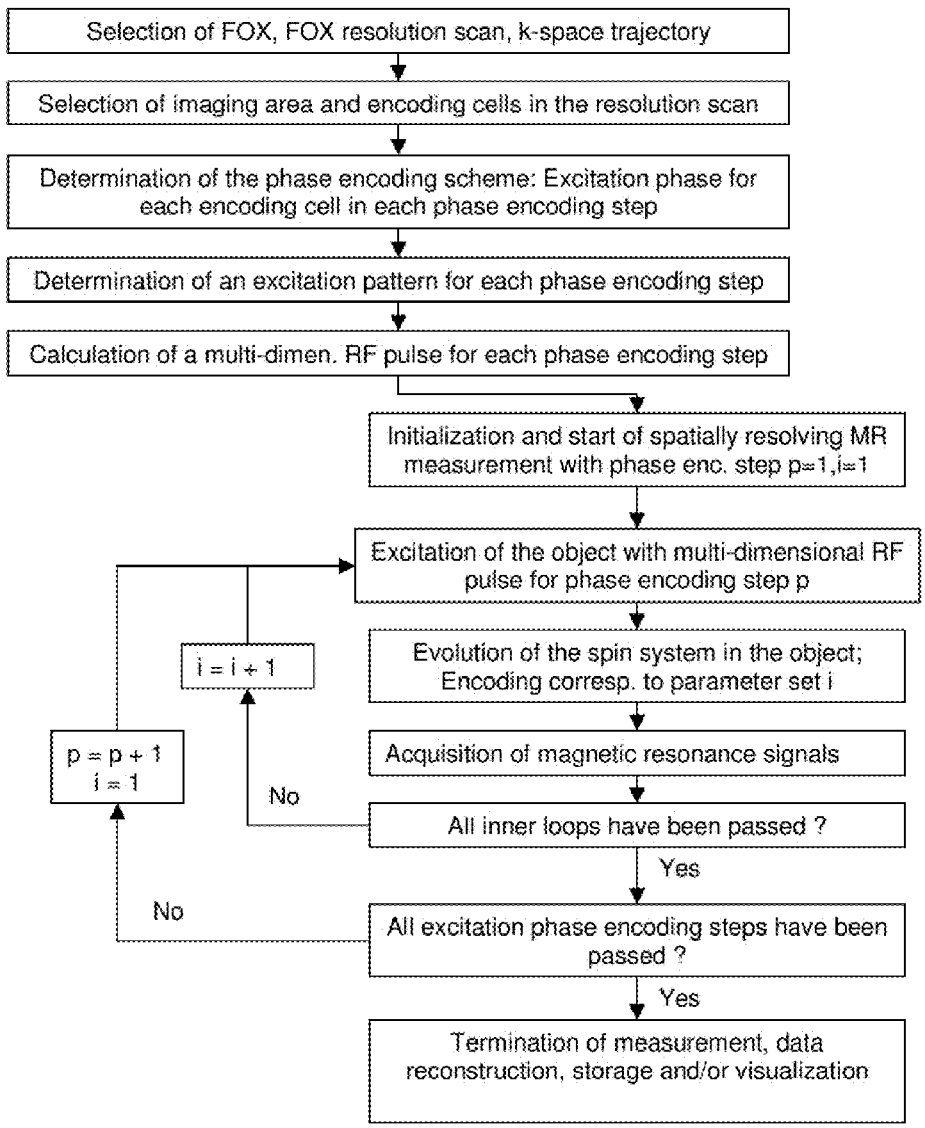
FIG. 3 shows a flow chart of the inventive method, in which each individual excitation phase encoding step is repeated, and additional gradient pulses are varied in an additional inner loop.
Figure 4:
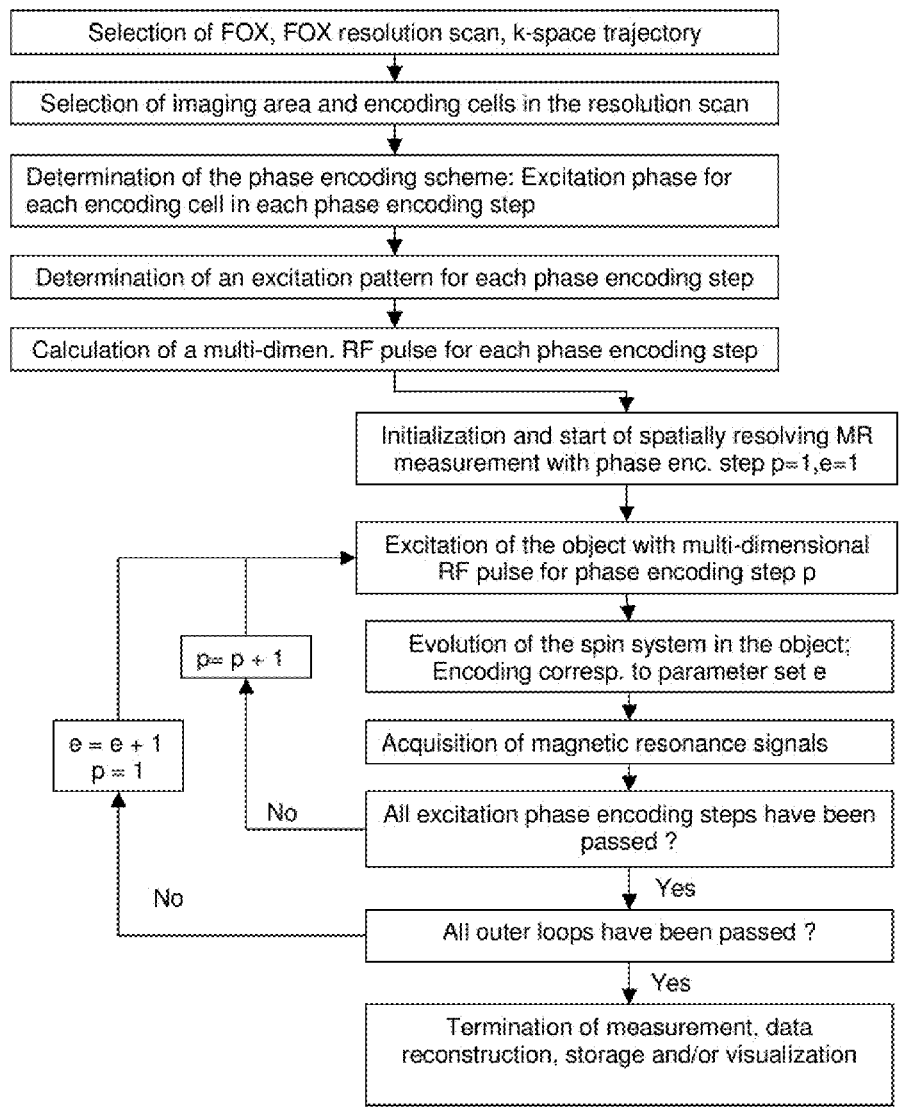
FIG. 4 shows a flow chart of the inventive method, in which the entire set of phase encoding steps is repeated in an additional outer loop.
Figure 5:
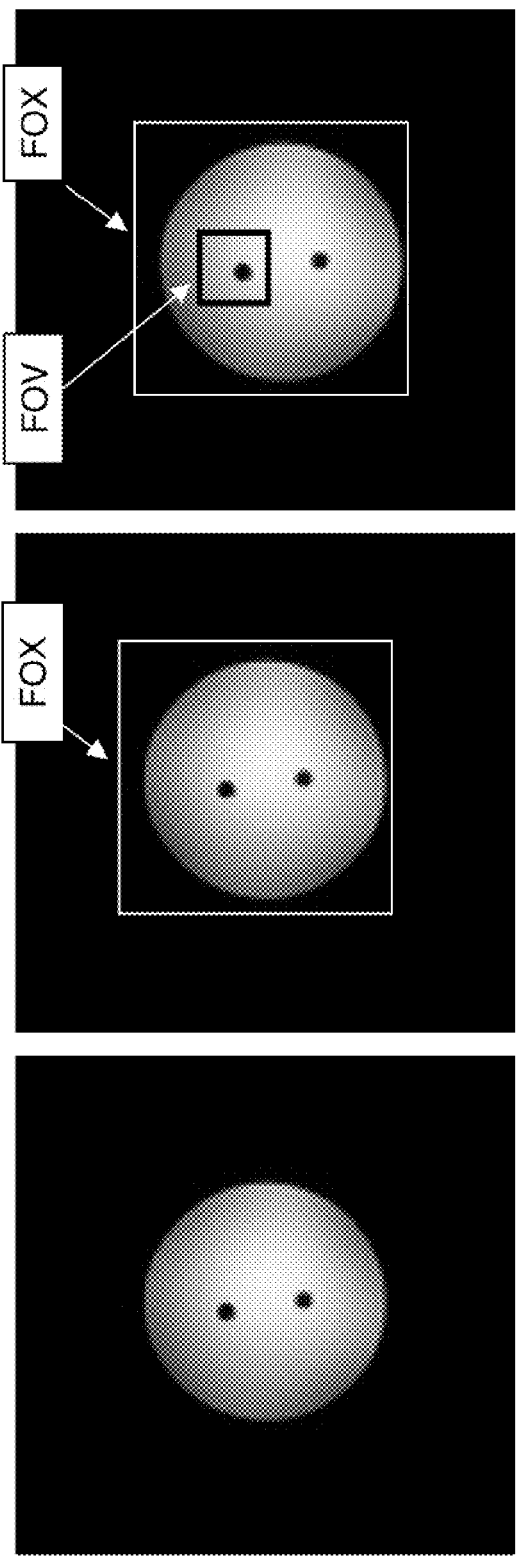
FIG. 5a shows a pilot image of a slice of an object under investigation, acquired with a conventional MR imaging sequence.
FIG. 5b shows the pilot image of FIG. 5a with superposed excitation area (FOX)
FIG. 5c shows the pilot image of FIG. 5b with additionally superposed imaging area (FOV)

Realization of additional spatial encoding through embedding additional gradient pulses between excitation and read-out period corresponding to an additional classical phase encoding scheme. In accordance with this additional encoding scheme, either each individual excitation phase encoding step is repeated in an additional inner loop through variation of the additional gradient pulses, as is shown in FIG. 3, or the entire set of the described excitation phase encoding steps is repeated in an outer loop, wherein, as is schematically described in FIG. 4, the additional gradient pulses are maintained during passage of a set of the excitation phase encoding steps, and are changed only prior to transition to the following passage of the entire set of excitation phase encoding steps in accordance with the additional phase encoding scheme. FIGS. 3 and 4 schematically show the variation of the measuring parameters in these loops, which are decisive for additional encoding.

The inventive method realizes partial, in particular also complete, spatial encoding of the magnetic resonance signals already during excitation of the nuclear spins to be measured, wherein imposition of spatial encoding of the nuclear spins to be measured is performed during excitation of the nuclear spins using multi-dimensional radio frequency pulses. This considerably reduces signal acquisition delays after excitation.

For this reason, this method permits spatially resolved measurement of nuclei with very short transverse relaxation times, e.g. $^{23}$Na and $^{11}$B, and tissue with very short transverse relaxation times, e.g. lung parenchyma and cartilage. The reduction of the acquisition delay also suppresses motion artefacts.

The inventive method determines the two-dimensional distribution of magnetic resonance signals of a flat region of the material or tissue to be investigated, wherein, for spatial description within this area, the coordinate pairs are merely determined on the basis of the spatial encoding performed during excitation. When three-dimensional RF pulses are used, this distribution may also be determined for areas of any curvature based on the encoding during excitation.

It also allows determination of a three-dimensional distribution of magnetic resonance signals within a spatially extended region of any shape of the material or tissue to be investigated. This is realized by using a two-dimensional RF pulse for encoding two spatial directions during excitation, and determining the third coordinate through frequency encoding during data read-out using a read gradient which is orthogonal to the gradients of the two-dimensional RF pulse. A three-dimensional RF pulse may alternatively also be used, which permits complete encoding for all three spatial directions already during excitation.

All phase encoding steps of both above-described method variants are performed with basically identical gradient pulses, and encoding is exclusively realized through variation of the amplitude and phase behavior with time of the RF pulses, such that many measuring errors that occur in classical spatial encoding and are caused by imperfections of the gradient generation, are intrinsically compensated for.

One essential property of the inventive spatial encoding is the fact that this encoding is generally not performed for the entire object under investigation, as is required for conventional spatial encoding methods, but can be limited to the imaging area. If phase ramps are e.g. used for encoding the individual resolution grid cells, wherein the phase values of the encoding cells for one phase encoding step substantially linearly increase in one predetermined spatial direction in each case, the dynamic region of the phase values required for encoding can be fully utilized for maximum extension of the imaging area in this direction, since the regions of the object under investigation, which are located outside of the imaging area, require no phase variation.

Another advantageous property of the inventive spatial encoding is that the order of the encoding cells can, in principle, be freely selected. The phase variation need e.g. not correspond to the bases of a substantially spatially continuous function, as is the case in conventional Fourier encoding methods. If Fourier encoding is used in connection with the inventive method, the linearly increasing phase values to be realized for a phase encoding step may e.g. be allocated to the encoding cells in any order.

There are also alternative choices with respect to the dimensionality of the encoding scheme that is used. A three-dimensional imaging area can be encoded with a three-, two- or one-dimensional scheme, a two-dimensional imaging area can be encoded with a two- or one-dimensional scheme, and be accordingly reconstructed. An encoding scheme is preferred whose dimension corresponds to the distribution to be determined and which prevents small deviations in phase definition during excitation from causing great changes in the locations reconstructed from the actually realized phase values.

The invention is particularly advantageous in that the imaging area can be very well adjusted to the region(s) which is/are of interest for spatially resolved investigation within the object under investigation, e.g. due to anatomical, morphological or functional conditions. The accuracy of this adjustment is primarily determined by the predetermined resolution grid, as long as the experimental conditions are set up in accordance with this grid. This adaptability also excludes certain regions of the object under investigation which could disturb the measurement, e.g. pulsating blood vessels in case of in-vivo investigations.

It is also possible to adjust the orientation of the resolution grid and thereby the direction of encoding, which is usually determined by the orientation of the resolution grid, to the geometrical conditions of the imaging area, without restrictions.

The limitation of spatial encoding to the imaging area due to the associated reduced number of phase encoding steps may moreover be advantageous with respect to the measuring time to be used, in particular, when this imaging area is very small compared to the dimensions of the object under investigation and is to be investigated with high spatial resolution. This means that the inventive method offers the possibility to efficiently perform magnetic resonance microscopy of inner structures of an extended object under investigation, and offers the additional advantage that tissue and materials can also be detected with extremely short relaxation times.

Additional spatial encoding through classical phase encoding in a period subsequent to excitation and/or through classical frequency encoding during data acquisition can be advantageously used for different aims and applications. This depends i.a. on whether and to which extent this additional spatial encoding with respect to the encoded volume and/or with respect to the encoding direction is basically redundant or complementary with respect to the encoding performed during excitation, and how the later time of this encoding enters the measured spatial information. For example, by using this additional spatial encoding, the spatial resolution of the magnetic resonance signals of substantially resting nuclear spins can be improved, when the two encodings complement each other. Imaging errors may also be corrected when both encodings provide basically identical spatial information. For moved nuclear spins, spatial encoding performed during excitation and the later classical spatial encoding are e.g. advantageously performed in different volumes of the object under investigation, thereby gaining information about the motion of nuclear spins from the excitation volume to the classically encoded detection volume within the delay time.

The inventive method may also be advantageously used in volume-selective spectroscopy: By dividing the region to be investigated into several encoding cells as the imaging area, one separate spectrum can be reconstructed for each encoding cell. When the magnetic basic field within the imaging area is inhomogeneous, the spectra of the individual encoding cells are displaced relative to each other. This instrumental imperfection can be corrected by moving the individual spectra on top of each other, e.g. by using a spectral reference line or due to known magnetic field charts, and the overall spectrum obtained through superposition from the individual spectra corrected in this fashion has a better spectral resolution than a spectrum obtained from the region to be investigated without inventive spatial encoding.

A preferred embodiment is explained below with respect to FIGS. 5-13. It concerns acquisition of a two-dimensional image of the magnetic resonance signals of a thin layer of an object under investigation. Two-dimensional spatial encoding within this layer is realized through excitation with two-dimensional RF pulses, and slice selection is realized using refocusing pulses under the action of a gradient which is orthogonal to this slice.

For measurement planning, a pilot image of a section through the object under investigation is initially acquired with conventional magnetic resonance acquisition technology. The pilot image of FIG. 5a is a cylindrical liquid phantom with two immersed plastic rods. In accordance with the white frame shown in FIG. 5b, an excitation region FOX (field of excitation) is selected, which covers the entire object in the illustrated case. The excitation region FOX is comprehensively superposed by an orthogonal resolution grid with 64×64 square resolution grid cells (not shown). This resolution grid corresponds to the discrete image points of the excitation pattern of the transverse magnetization, i.e. it determines the spatial resolution for realizing this excitation pattern. An imaging area FOV (field of view) is then defined within the excitation area FOX, which is to be imaged by the experiment (FIG. 5c). The imaging area FOV is a partial area of the excitation area FOX and corresponds to 16×16 fields of the resolution grid in this embodiment.

Figure 6:
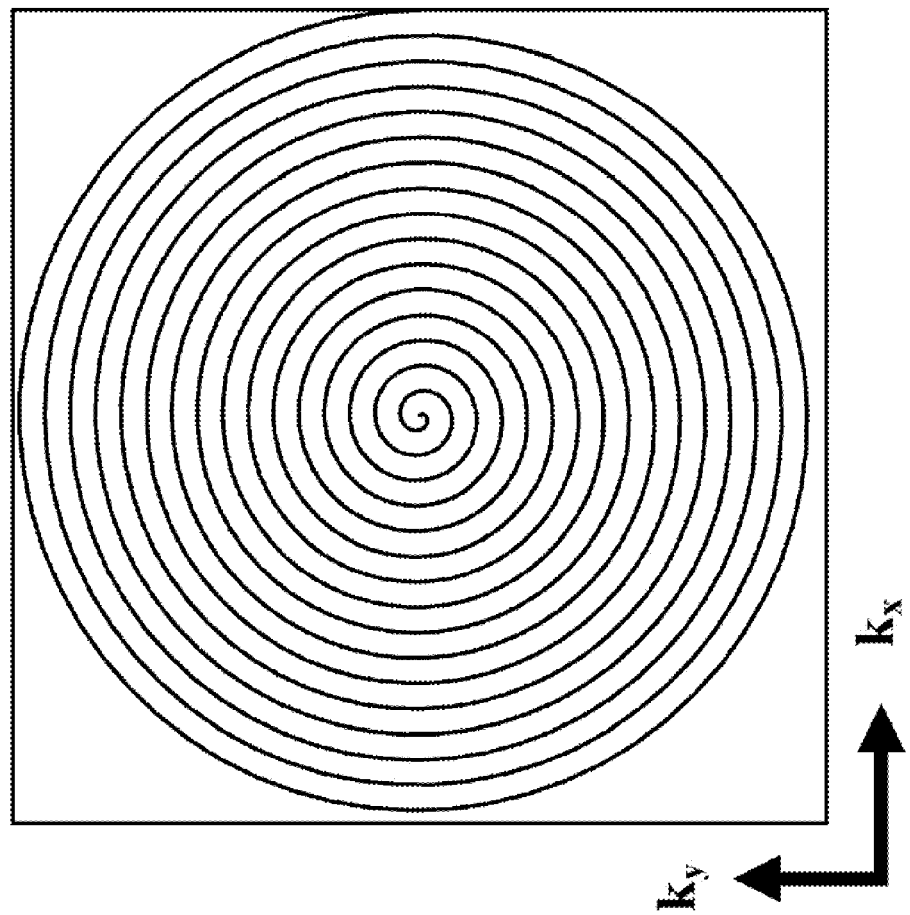
FIG. 6 shows a schematic view of a spiral k-space trajectory which is advantageous for imaging.
Figure 7:
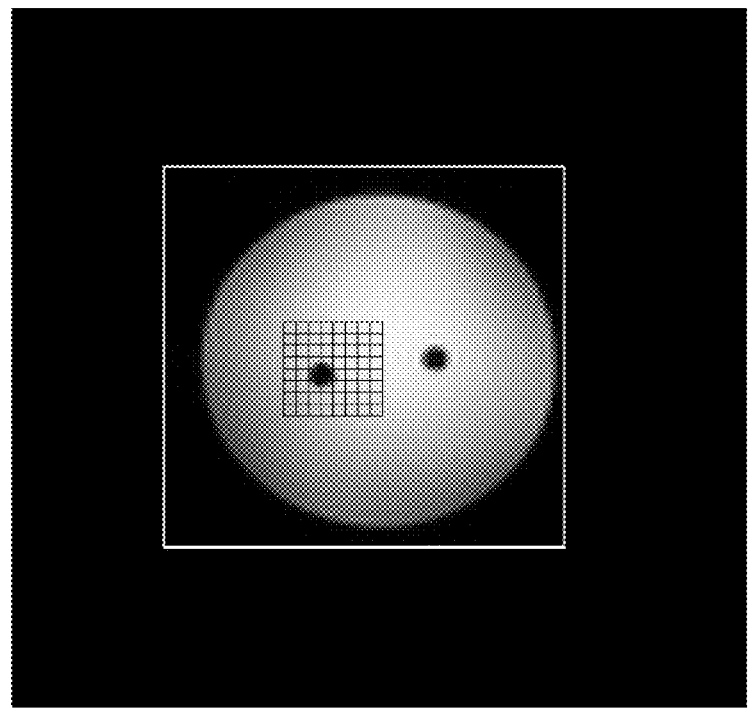
FIG. 7 shows the pilot image of FIG. 5c with additionally superposed grid of encoding cells for spatial encoding.

The experiment is moreover planned by using a k-space trajectory that is adjusted to the problem. A two-dimensional RF pulse is to be used in this case, and consequently a spiral k-space trajectory would be suitable, which is schematically shown in FIG. 6 and is to be passed through from the outside to the inside in the experiment through corresponding switching of gradient pulses.

The following definition step determines the phase encoding scheme for spatial encoding during excitation. Four neighboring fields of the resolution grid cells of the resolution grid, which are located within the imaging area FOV, are combined in each case into an encoding cell in the present example, to produce a two-dimensional grid of 8×8 encoding cells (shown in FIG. 7), which exactly covers the selected imaging area FOV. A two-dimensional phase encoding scheme with 64 phase encoding steps is determined for this two-dimensional matrix of 64 encoding cells, which permits later image reconstruction using two-dimensional Fourier transformation. For later data reconstruction, the phase encoding steps and the associated measuring data are suitably ordered in accordance with a two-dimensional scheme, wherein each phase encoding step p, with p=1, 2, . . . 64 is designated by an index pair (k, l), with p=(l−1)*8+k, k=1, . . . , 8 and l=1, . . . , 8. A complex excitation pattern must be defined for each phase encoding step, i.e. the amplitude and phase of each of the 64×64 resolution grid cells must be predetermined. All resolution grid cells outside of the imaging area FOV are given an amplitude value of 0 for all phase encoding steps, whereas all resolution grid cells located in the imaging area FOV are given the same amplitude which is identical for all phase encoding steps and is calculated from the desired flip angle. The resolution grid cells associated with the encoding cell in the n-th line and m-th column receive the following phase value for the phase encoding step (k, l):

$$\varphi_{mn}^{kl} = 2\pi \cdot \left( \frac{k \cdot m}{M} + \frac{l \cdot n}{N} \right)$$

wherein M is the number of columns and N is the number of lines of the matrix of the encoding cells, with M=N=8 in the described embodiment.

Figure 8:
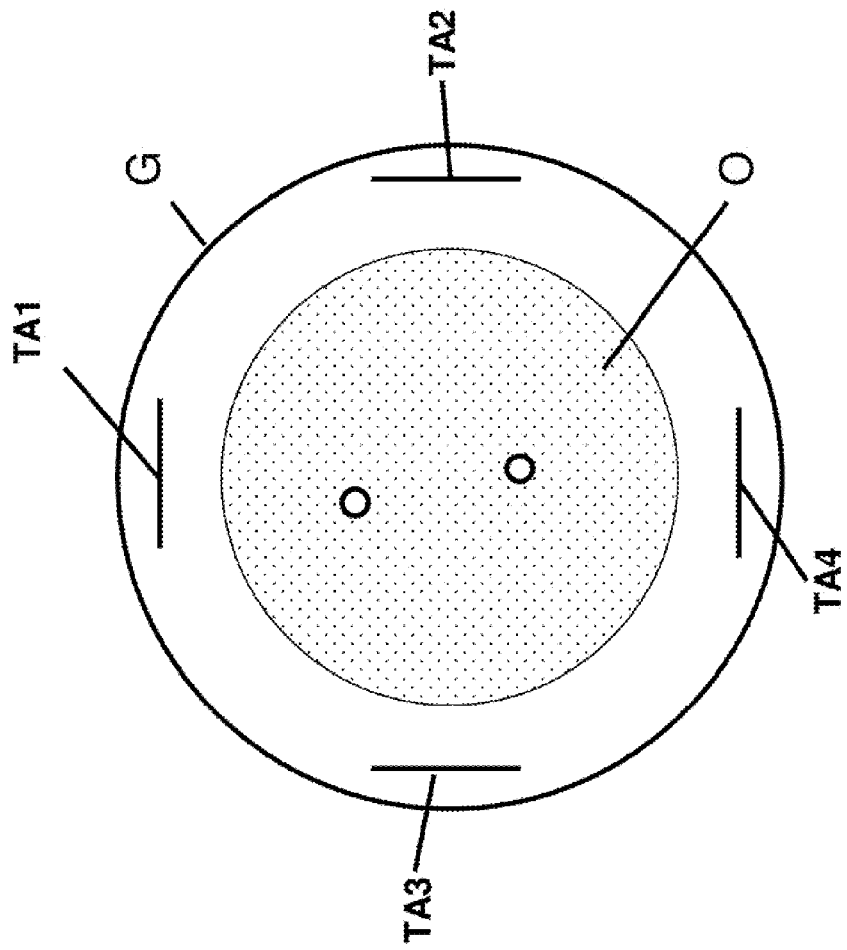
FIG. 8 shows a schematic view of a transmitting antenna means which is suited for performing the inventive method.
Figure 9A:
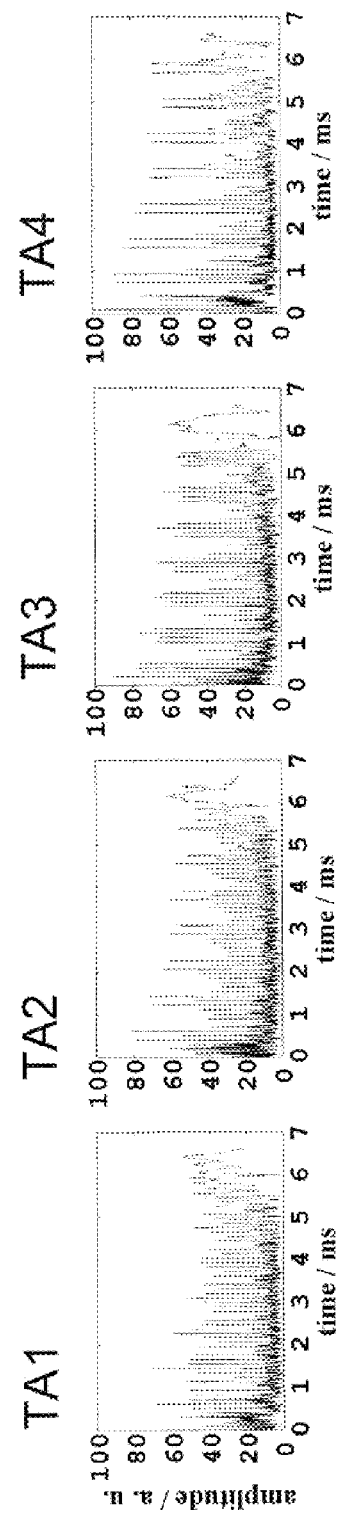
FIG. 9 shows a view of RF pulse wave shapes that are emitted by each transmitting element for generating the excitation pattern of one individual phase encoding step.
Figure 9B:
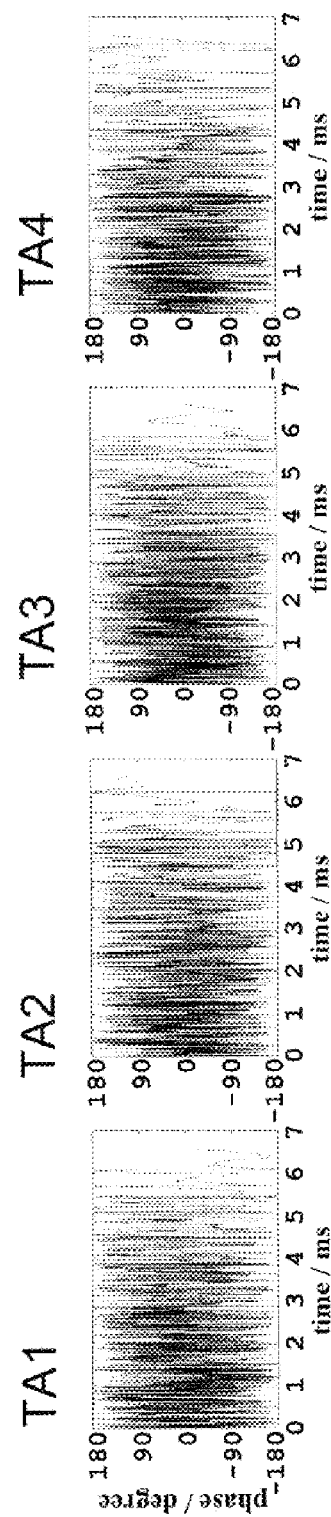

The experiment is prepared by calculating the gradient and RF pulses to be applied. The gradient pulses are determined in accordance with conventional methods, as is described e.g. in paragraph 17.6 in [1]. FIG. 8 shows an object under investigation O, which is surrounded by a transmitting antenna means with four transmitting elements TA1, TA2, TA3, TA4, and a gradient system G. For each phase encoding step, a complex RF pulse wave shape is calculated from the corresponding excitation pattern for each of the four transmitting channels. The method of Yip [10] or Grissom [11] may thereby be applied. This means, the amplitude and phase behaviors of the four RF pulse wave shapes to be simultaneously applied are calculated by solving a matrix equation which connects the excitation pulses and the excitation pattern via a transition matrix, which depends i.a. on the determined transmission profiles of the transmission elements TA1, TA2, TA3, TA4 and the selected k-space trajectory. FIG. 9a shows the amplitude dependence, and FIG. 9b shows the phase dependence of RF pulse wave shapes, calculated in this fashion, of the four transmitting elements TA1, TA2, TA3, TA4 for one phase encoding step.

The experiment is performed by carrying out a sequence of 64 phase encoding steps, wherein each phase encoding step contains the sequence of gradient pulses $G_x$, $G_y$ and RF pulse $HF_A$, which is schematically shown in FIG. 10. After irradiation of the RF pulse wave shapes of the RF pulse $HF_A$, calculated for the respective phase encoding step, on the four transmitting elements TA1, TA2, TA3, TA4 with simultaneous action of the gradient pulses $G_x$, $G_y$, which realize the predetermined k-space trajectory, slice-selective refocusing is performed after a time delay TE/2 using a 180° RF pulse $HF_R$ under the effect of a slice selection gradient $G_s$ which is applied orthogonally relative to the gradient pulses $G_x$, $G_y$ of the two-dimensional RF pulse. After a time delay TE after termination of the excitation, a complex data point in the center of the echo E is acquired.

Figure 11C:
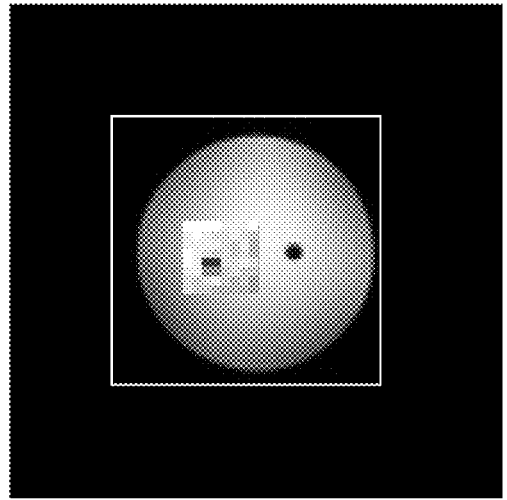
Figure 11B:
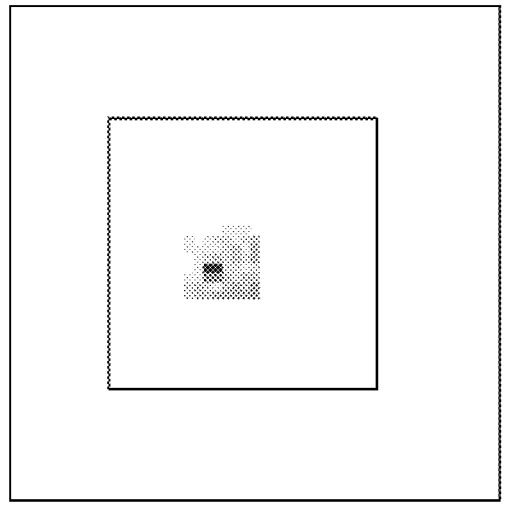
FIG. 11b shows the image of the imaging area (FOV) of FIG. 11a, which is reconstructed from the excitation-encoded measuring data using two-dimensional Fourier transformation.
Figure 11A:
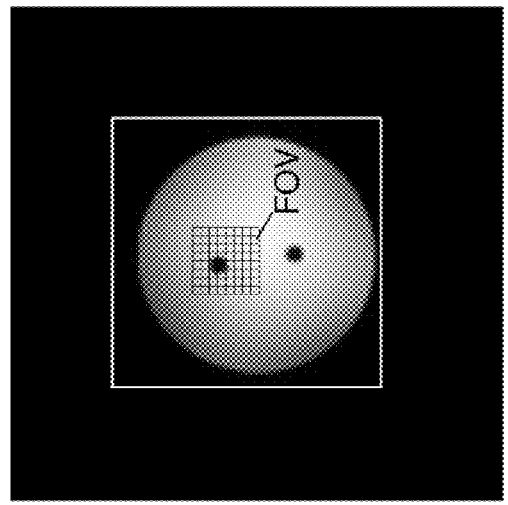
FIG. 11a shows the pilot image of FIG. 7 with imaging area (FOV) as a reference.

An image of the imaging area FOV is reconstructed from the complex data points acquired in all phase encoding steps using two-dimensional Fourier transformation, as is shown in FIGS. 11a-c. For orientation, FIG. 11a shows again the imaging area FOV, which is predetermined by the pilot image, and the grid of the encoding cells. FIG. 11b shows the result of reconstruction, i.e. the image of the imaging area FOV measured by excitation phase encoding, and FIG. 11c shows embedding of this image in the pilot image. FIG. 11b shows the substantial result of this embodiment. FIGS. 11a and 11c are only auxiliary views for illustrating the meaning of this result.

Figure 13C:
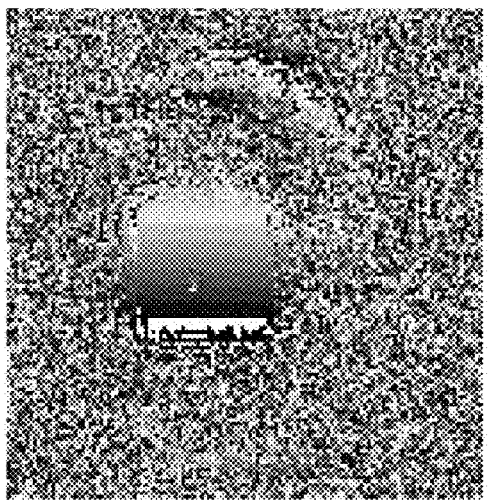
FIG. 13c shows a map of the realized relative phase distribution of the excitation pattern within the excitation region (FOX) shown in FIG. 11a related to the preceding phase encoding step.
Figure 13B:
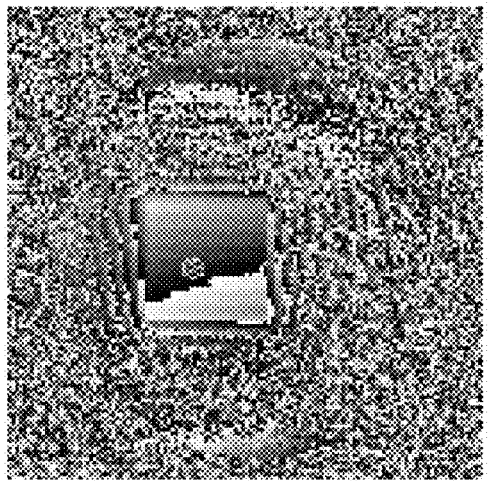
FIG. 13b shows a map of the realized absolute phase distribution of the excitation pattern within the excitation region (FOX) shown in FIG. 11a in a defined phase encoding step.
Figure 13A:
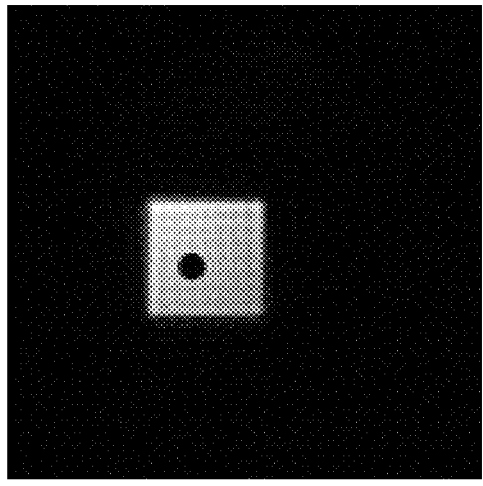
FIG. 13a shows a map of the realized amplitude distribution of the excitation region (FOV) shown in FIG. 11a in a defined phase encoding step.

Since the generation of the different excitation patterns for each phase encoding step is an essential component of the inventive method, it is of interest for the verification of the method to separately determine the actually realized excitation patterns. This can be performed with a classical imaging sequence, which is described in FIG. 12. After excitation with the gradient pulses $G_x$, $G_y$, which are calculated for a defined excitation phase encoding step, and RF pulse wave shapes of the RF pulse $HF_A$, a classical spin-echo image is acquired from which the spatial distribution of the intensity magnitudes and phase is calculated. FIG. 13a shows such a magnitude image, FIG. 13b shows the phase distribution for a phase encoding step and FIG. 13c shows the phase difference distribution for two successive phase encoding steps. For realization of spatial encoding, it is decisive that the magnitude distribution within the imaging area FOV is sufficiently homogeneous and also that a substantially linear increase in the relative phases in one of the two encoding directions is approximated, which is shown in FIGS. 13a and 13c.

LIST OF REFERENCE NUMERALS

AX, AY, AZ Gradient amplifier for x-, y-, z-gradients
COMP Computer system
DSK digital storage unit
E Spin echo
FOV Imaging area, Field of View
FOX Excitation area, Field of Excitation
$G_s$ Slice selection gradient
$G_x$, $G_y$ Gradient pulse in x-, y-direction
GX, GY, GZ Gradient coil for x-, y-, z-gradients
$HF_A$ RF excitation pulse
$HF_R$ RF refocusing pulse
KB Computer keyboard
M Main magnet
MON Monitor
O Object under investigation
PNTR Display instrument
RA1, . . . , RAm, Receiver elements
RX1 . . . RXm Receiver units
SEQ Sequence control unit
TA1 . . . TAn Transmitting elements
TX1 . . . TXn RF power transmitter
V Volume under investigation

REFERENCES

[1] Bernstein, M. A.; King K. F.; Zhou, X. J.: *Handbook of MRI Pulse Sequences*. Elsevier Academic Press (2004)
[2] de Graaf, R. A.: *In vivo NMR spectroscopy*. John Wiley & Sons Ltd (1998)
[3] U.S. Pat. No. 5,903,149, Gonen, O. et al.: Three-Dimensional Localized Proton NMR Spectroscopy Using a Hybrid of One-Dimensional Hadamard with Two-Dimensional Chemical Shift Imaging
[4] Pauly, J.; Nishimura, D.; Macovski A.: A k-space analysis of small-tip-angle excitation. In: Journal of Magnetic Resonance 81 (1989), S. 43-56
[5] U.S. Pat. No. 5,270,653, Pauly, J. M.: Selective Three Dimensional Excitation for Magnetic Resonance Applications.
[6] Saekho, S.; Yip, C.-Y.; Noll, D. C.; Boada, F. E.; Stenger, V. A.: Fast-$k_z$ three-dimensional tailored radiofrequency pulse for reduced B1 inhomogeneity. In: Magnetic Resonance in Medicine 55 (2006), S. 719-724
[7] U.S. Pat. No. 6,005,391, Börnert, P. et al.: Method for Determining the Spatial and/or Spectral Distribution of Nuclear Magnetization
[8] Katscher U.; Börnert, P.; Leussler, C.; van den Brink, J. S.: Transmit SENSE. In: Magnetic Resonance in Medicine 49 (2003), S. 144-150.
[9] Zhu, Y.: Parallel Excitation With an Array of Transmit Coils. In: Magnetic Resonance in Medicine 51 (2004), S. 775-784
[10] Yip, C.-Y.; Fessler, J. A.; Noll, D. C.: Iterative RF pulse design for multidimensional, small-tip-angle selective excitation. In: Magnetic Resonance in Medicine 54 (2005), S. 908-917
[12] Grissom, W.; Yip, C.-Y.; Zhang, Z.; Stenger, V. A.; Fessler, J. A.; Noll, D. C.: Spatial domain method for the design of RF pulses in multicoilrallel excitation. In: Magnetic Resonance in Medicine 56 (2006), S. 620-629

I claim:
1. A method for determining the spatial distribution of magnetic resonance signals from a predetermined imaging area, which consists of at least one extended region within a volume of investigation of a nuclear magnetic resonance apparatus, wherein a transverse magnetization of nuclear spins is excited through multi-dimensional RF (radio frequency) pulses using magnetic field gradients and RF trans- mitting antenna means, said antenna means comprising at least one transmitting element, wherein in a definition step, a k-space trajectory which is to be generated through magnetic field gradient switching and which must be followed during excitation, as well as a phase encoding scheme with phase encoding steps are determined for spatial encoding using a computer or controller, in a preparatory step, the amplitude and phase behavior with time of the RF pulses to be irradiated for exciting the transverse magnetization of the nuclear spins is calculated for each transmitting element of the transmitting antenna means for the selected k-space trajectory using the computer or controller, in an execution step, transverse magnetization of nuclear spins within the volume of investigation is excited during each phase encoding step by a multi-dimensional RF pulse, phase encoding takes place according to the phase encoding scheme, and magnetic resonance signals are acquired using receiver antenna means, in a reconstruction step, a two- or three-dimensional spatial distribution and/or spatial allocation of the magnetic resonance signals and/or values derived therefrom are calculated from the magnetic resonance signals acquired in all phase encoding steps using the computer or controller, and in a display/storage step, the results of reconstruction and/or the one or more values derived therefrom are stored and/or displayed, wherein further in the definition step, a two- or three-dimensional resolution grid with resolution grid cells that covers the object under investigation is predetermined, an at least two-dimensional grid of directly neighboring encoding cells is determined for each region of the imaging area, wherein each encoding cell consists of one or more resolution grid cells of the imaging area, for which the same spatial encoding is to be performed, and for each phase encoding step, a complex excitation pattern is defined which is given by amplitudes and phases of the transverse magnetization to be excited in all resolution grid cells, in which the amplitudes assigned to the resolution grid cells are set within the imaging area in correspondence with a predetermined distribution identically for each phase encoding step, the amplitudes assigned to the remaining resolution grid cells are set to zero, and the phases assigned to the resolution grid cells within the imaging area are set in accordance with the defined phase encoding scheme, in the preparatory step, the amplitude and phase behavior of the RF pulses to be irradiated is calculated for each defined complex excitation pattern of the phase encoding steps and for each transmitting element, in the execution step, the transverse magnetization of the nuclear spins is repeatedly excited, wherein for each phase encoding step, the RF pulse(s) calculated for the transmitting element(s) is/are applied during passage of the predetermined k-space trajectory, such that phase encoding is performed within the imaging area during excitation of the transverse magnetization of the nuclear spins.

2. The method of claim 1, wherein the transverse magnetization of the nuclear spins is excited by transmitting antenna means comprising at least two transmitting elements.

3. The method of claim 2, wherein the k-space trajectory is undersampled.

4. The method of claim 1, wherein each phase encoding step is performed with identical gradient pulses.

5. The method of claim 1, wherein the k-space trajectory that is used comprises at least one spiral part which is passed through from the outside to the inside or from the inside to the outside.

6. The method of claim 1, wherein the imaging area is adjusted to anatomical, morphological or functional conditions of the object under investigation.

7. The method of claim 1, wherein a two-dimensional RF pulse is used for excitation, and spatial encoding and/or spatial selection in the third spatial direction is performed via frequency encoding under the action of a gradient in a direction orthogonal with respect to excitation encoding during data acquisition.

8. The method of claim 1, wherein an FID (free induction decay) or spin echo is acquired in each phase encoding step and the spatial distribution and/or spatial allocation of one data point of the FID or spin echo or a combination of several corresponding data points of the FID or spin echo is/are determined.

9. The method of claim 1, wherein each phase encoding step includes acquisition of an FID (free induction decay) or spin echo from which the spectral distribution is calculated and determination of the spatial distribution and/or spatial allocation of one component or a combination of several components of the spectral distribution or values derived therefrom.

10. The method of claim 1, wherein the phase encoding scheme is determined in such a fashion that different, not directly spatially neighboring, resolution grid cells obtain the same spatial encoding within the imaging area.

11. The method of claim 1, wherein, in dependence on the location, different numbers of neighboring resolution grid cells obtain the same spatial encoding within the imaging area, in each case, whereby the phase encoding scheme is determined to obtain a spatially varying spatial resolution which can be adjusted to the conditions of the object under investigation.

12. The method of claim 1, wherein the allocations of the magnetic resonance signals to the encoding cells that are obtained from phase encoding during excitation of the nuclear spins are used to perform spatially dependent corrections of the acquired signals and/or reconstructed and/or derived data, in particular, correction of errors which are caused by spatial inhomogeneities in the basic magnetic field.

13. The method of claim 1, using separate spatial encoding subsequent to excitation by means of gradients to obtain additional spatial information of the magnetic resonance signals.

14. The method of claim 3, wherein each phase encoding step is performed with identical gradient pulses.

15. The method of claim 3, wherein the imaging area is adjusted to anatomical, morphological or functional conditions of the object under investigation.

16. The method of claim 3, wherein a two-dimensional RF (radio frequency) pulse is used for excitation, and spatial encoding and/or spatial selection in the third spatial direction is performed via frequency encoding under the action of a gradient in a direction orthogonal with respect to excitation encoding during data acquisition.

17. The method of claim 3, wherein an FID (free induction decay) or spin echo is acquired in each phase encoding step and the spatial distribution and/or spatial allocation of one data point of the FID or spin echo or a combination of several corresponding data points of the FID or spin echo is/are determined.

18. The method of claim 3, wherein each phase encoding step includes acquisition of an FID (free induction decay) or spin echo from which the spectral distribution is calculated and determination of the spatial distribution and/or spatial allocation of one component or a combination of several components of the spectral distribution or values derived therefrom.

19. The method of claim 3, wherein, in dependence on the location, different numbers of neighboring resolution grid cells obtain the same spatial encoding within the imaging area, in each case, whereby the phase encoding scheme is determined to obtain a spatially varying spatial resolution which can be adjusted to the conditions of the object under investigation.

20. The method of claim 3, using separate spatial encoding subsequent to excitation by means of gradients to obtain additional spatial information of the magnetic resonance signals.

* * * * *